United States Patent
Havanur

(10) Patent No.: US 7,999,600 B2
(45) Date of Patent: *Aug. 16, 2011

(54) DEVICE AND METHOD FOR LIMITING DI/DT CAUSED BY A SWITCHING FET OF AN INDUCTIVE SWITCHING CIRCUIT

(75) Inventor: Sanjay Havanur, Cupertino, CA (US)

(73) Assignee: Alpha and Omega Semiconductor, Inc., Sunnyvale, CA (US)

(*) Notice: Subject to any disclaimer, the term of this patent is extended or adjusted under 35 U.S.C. 154(b) by 175 days.

This patent is subject to a terminal disclaimer.

(21) Appl. No.: 12/479,552

(22) Filed: Jun. 5, 2009

(65) Prior Publication Data

US 2009/0243715 A1    Oct. 1, 2009

Related U.S. Application Data

(63) Continuation of application No. 11/864,686, filed on Sep. 28, 2007, now Pat. No. 7,564,292.

(51) Int. Cl.
  *H03K 17/04*    (2006.01)
(52) U.S. Cl. .................... 327/377; 327/380
(58) Field of Classification Search .......... 327/374, 327/376, 377, 379, 380, 384, 389, 427, 434, 327/108, 110
  See application file for complete search history.

(56) References Cited

U.S. PATENT DOCUMENTS

| | | | | |
|---|---|---|---|---|
| 4,258,310 A * | 3/1981 | Asakawa et al. | | 323/281 |
| 5,475,329 A * | 12/1995 | Jones et al. | | 327/377 |
| 5,621,257 A * | 4/1997 | Kawakami | | 307/125 |
| 5,825,216 A * | 10/1998 | Archer et al. | | 327/110 |
| 6,127,746 A * | 10/2000 | Clemente | | 307/131 |
| 6,577,171 B1 * | 6/2003 | Filippo et al. | | 327/108 |
| 6,992,520 B1 * | 1/2006 | Herbert | | 327/377 |
| 7,564,292 B2 * | 7/2009 | Havanur | | 327/377 |
| 7,724,046 B2 * | 5/2010 | Wendt et al. | | 327/110 |
| 2008/0278256 A1 * | 11/2008 | Harvey | | 333/12 |

* cited by examiner

*Primary Examiner* — Hai L Nguyen
(74) *Attorney, Agent, or Firm* — Chein-Hwa Tsao CH Emily LLC

(57) ABSTRACT

A circuit for limiting di/dt caused by a main switching FET during its turn-off against an inductive switching circuit is proposed. The circuit for limiting di/dt includes an auxiliary inductor in series with the main switching FET for inducing an auxiliary inductive voltage proportional to di/dt; an auxiliary FET in parallel with the main switching FET; the auxiliary FET gate is connected to produce a gate voltage equal to the auxiliary inductive voltage. When the di/dt tends to exceed a predetermined maximum rate of decrease the auxiliary FET produces an auxiliary current component counteracting further decrease of the di/dt. The main switching FET and the auxiliary FET can be formed from a single die with shared source and drain; the auxiliary inductor can be implemented as a parasitic inductance of an inherently required bonding wire connecting the main switching FET to its device terminal to simplify packaging with reduced cost.

19 Claims, 9 Drawing Sheets

PRESENT INVENTION

PRESENT INVENTION

WAVEFORM

PRESENT
INVENTION

PRESENT INVENTION
WAVEFORM

WAVEFORM

PRESENT INVENTION
WAVEFORM

PRESENT INVENTION

PRESENT INVENTION

PRESENT INVENTION

PRESENT INVENTION**

DEVICE AND METHOD FOR LIMITING DI/DT CAUSED BY A SWITCHING FET OF AN INDUCTIVE SWITCHING CIRCUIT

CROSS REFERENCE TO RELATED APPLICATIONS

This application is a continuation application of a US application entitled "A Device and Method for Limiting Di/Dt Caused by a Switching FET of an Inductive Switching Circuit" by Sanjay Havanur, with application# 11/864,686, filing date of Sep. 28, 2007 and publication# U.S.-2009-0085656, now U.S. Pat. No. 7,564,292, which is issued on Jul. 21, 2009 and hereinafter referred to as APOM009. The content of APOM009 is herein incorporated by reference for any and all purpose.

FIELD OF INVENTION

This invention relates generally to the field of power electronics. More specifically, the present invention is directed to noise control and suppression in a power switching circuit.

BACKGROUND OF THE INVENTION

The usage of power switching circuits has become ubiquitous in the electronics industry. A few examples of applications are switching power supplies, DC-DC voltage converters and DC-AC voltage converters.

During the operation of such power switching circuits, a frequently encountered situation is when power switching devices such as MOSFETs (Metal-Oxide-Semiconductor Field Effect Transistors) are turned off against unclamped or partially clamped inductive loads. During the turn off, a high rate of load current change, abbreviated as di/dt, is often impressed upon these inductive loads due to the gate drive of the power MOSFET device. This normally results in an associated voltage overshoot and ringing as the leakage inductive energy stored in the unclamped circuit inductances resonates with parasitic circuit capacitances before dying down. Excessive ringing can cause power losses and excessive peak voltages from the voltage overshoot can drive the power MOSFET device into avalanche breakdown with the risk of permanent device failure. Additionally, the voltage overshoot and ringing can also result in high levels of conducted and/or radiated EMI/RFI (electromagnetic interference/radio frequency interference) causing undesirable interference with the operation of other sensitive electronic systems nearby.

A number of studies have been conducted of the voltage overshoot and ringing phenomenon so as to minimize its adverse effects. Subsequent solutions include adding snubbers across the MOSFETs, slowing down the turn off speed by reducing the gate turn off current, etc. Such solutions typically either require many additional components and/or are inefficient. Therefore, there exists a need to cost effectively reduce such associated voltage overshoot and ringing as caused by the high rate of load current change di/dt. The following is a list of references relevant to the understanding of the present invention:

1. F Merienne, J Roudet, J. L. Schanen, "Switching disturbance due to source inductance for a power MOSFET: analysis and solutions", IEEE Power Electronics Specialists Conference, PESC 1996 Record, vol. 2, pp. 1743-1747.
2. G Nobauer, D Ahlers and J Ruiz-Sevillano, "A method to determine parasitic inductances in Buck Converter topologies" Infineon Application Note, Jun. 2004.
3. Qun Zhao, Goran Stojcic, "Characterization of Cdv/dt induced power loss in Synchronous Buck DC-DC converters", IEEE Applied Power Electronics Conference, APEC 2004, vol. 1, pp 292-297.
4. Bo Yang, Jason Zhang "Effect and Utilization of Common Source Inductance in Synchronous Rectification", IEEE Applied Power Electronics Conference, APEC 2005, Vol 3, pp 1407-1411.
5. W Teulings, J. L. Schanen, J Roudet, "MOSFET switching behavior under influence of PCB stray inductance", IEEE Industry Applications Conference, 1996. Vol 3, pp 1449-1453.

SUMMARY OF THE INVENTION

A circuit for limiting di/dt caused by a main switching FET during its unclamped or partially unclamped inductive turn-off is proposed. In application, the main switching FET is coupled to an external inductive switching circuit (ISC) having a ground GND, a supply voltage VIN and an inductive network having at least one inductor element inside. The circuit for limiting di/dt includes:

An auxiliary inductor in series connection with the main switching FET through its source. During operation an auxiliary inductive voltage proportional to di/dt is induced across the auxiliary inductor.

An auxiliary FET in parallel connection with the main switching FET. The gate of the auxiliary FET is connected to a terminal of the auxiliary inductor so as to result in a gate voltage equal to the auxiliary inductive voltage. Upon a tendency of the di/dt to exceed a pre-determined maximum rate of decrease (di/dt)MAX, the auxiliary FET automatically produces an auxiliary current component counteracting further decrease of the di/dt thus limits the maximum magnitude of di/dt to $(di/dt)_{MAX}$.

Where the main switching FET and the auxiliary FET are both n-channel FETs the following circuit connection applies:
VIN is connected to the inductive network.
One terminal of the auxiliary inductor and the gate of the auxiliary FET are both connected to the GND.
The drains of the main switching FET and the auxiliary FET are both connected to the inductive network.

Where the main switching FET and the auxiliary FET are both p-channel FETs the following circuit connection applies:
One terminal of the auxiliary inductor and the gate of the auxiliary FET are both connected to VIN.
The drains of the main switching FET and the auxiliary FET are both connected to the inductive network.
The inductive network is in turn connected to GND.

For applications where the ISC further includes a high-side FET, the following circuit connection applies:
The main switching FET acts as a low-side FET working in synchrony with the high-side FET to switch the inductive network.
VIN is connected to the high-side FET.
The auxiliary inductor and the gate of the auxiliary FET are both connected to GND.

A device for limiting di/dt caused by a switching FET during its unclamped or partially unclamped inductive turn-off is proposed. The device for limiting di/dt includes:
A main switching FET.
An auxiliary inductor in series connection with the main switching FET through its source. During operation an auxiliary inductive voltage proportional to di/dt is induced across the auxiliary inductor. An auxiliary FET in parallel connection with the main switching FET. The gate of the auxiliary FET is connected to a terminal of the auxiliary inductor so as to result in a gate voltage equal to the auxiliary inductive voltage. Upon a tendency of the di/dt to exceed a pre-determined maximum rate of decrease (di/dt)MAX, the auxiliary FET automatically produces an auxiliary current component counteracting further decrease of the di/dt thus limits the maximum magnitude of di/dt to $(di/dt)_{MAX}$. Thus, while turning off an unclamped or partially unclamped inductive load, the device for limiting di/dt prevents an associated excessive voltage overshoot and ringing in the unclamped or partially unclamped inductive load.

In one embodiment, the main switching FET and the auxiliary FET are formed from separate dies co-packaged together onto a leadframe.

In another embodiment, the main switching FET and the auxiliary FET are formed from a single die and share a common source and a common drain making the device for limiting di/dt a dual-gate FET.

At the final device packaging level, the auxiliary inductor can be implemented as a parasitic inductance of an inherently required bonding wire connecting the source of the main switching FET to its corresponding external device terminal to simplify the device packaging with reduced cost.

In one application, the main switching FET and the auxiliary FET can be both n-channel FETs.

In another application, the main switching FET and the auxiliary FET can be both p-channel FETs.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

FIG. 1C illustrates another prior art synchronous buck converter circuit where the body diode of the low side MOSFET turns off abruptly while the high side MOSFET is still turning on;

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

Figure 1A:
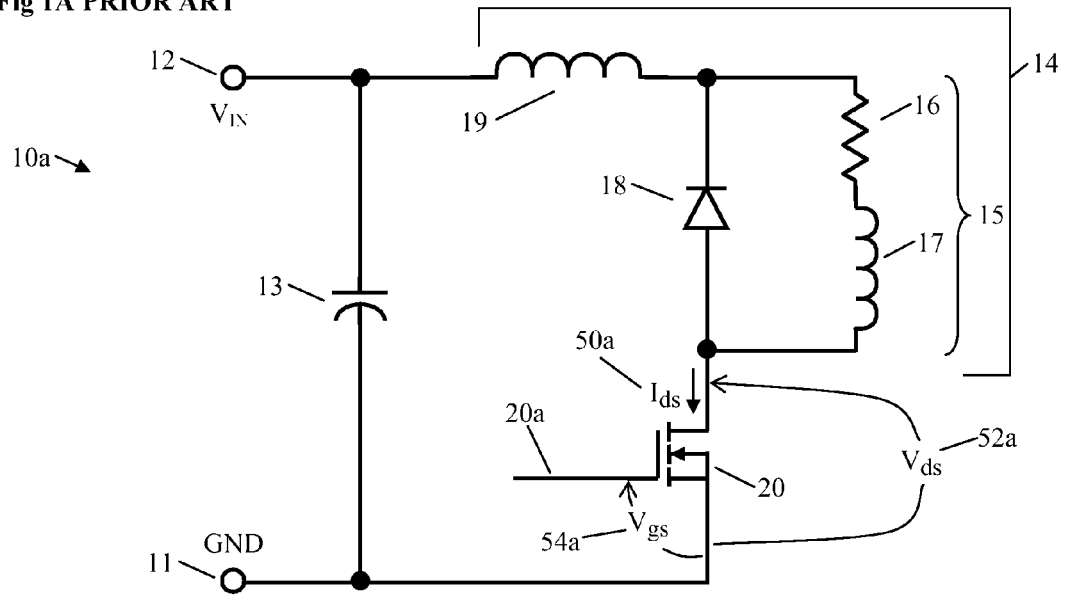
FIG. 1A illustrates a prior art single ended unclamped inductive switching circuit where a n-channel power MOSFET turns off quickly while carrying an inductive load current from an unclamped inductive load.
Figure 1B:
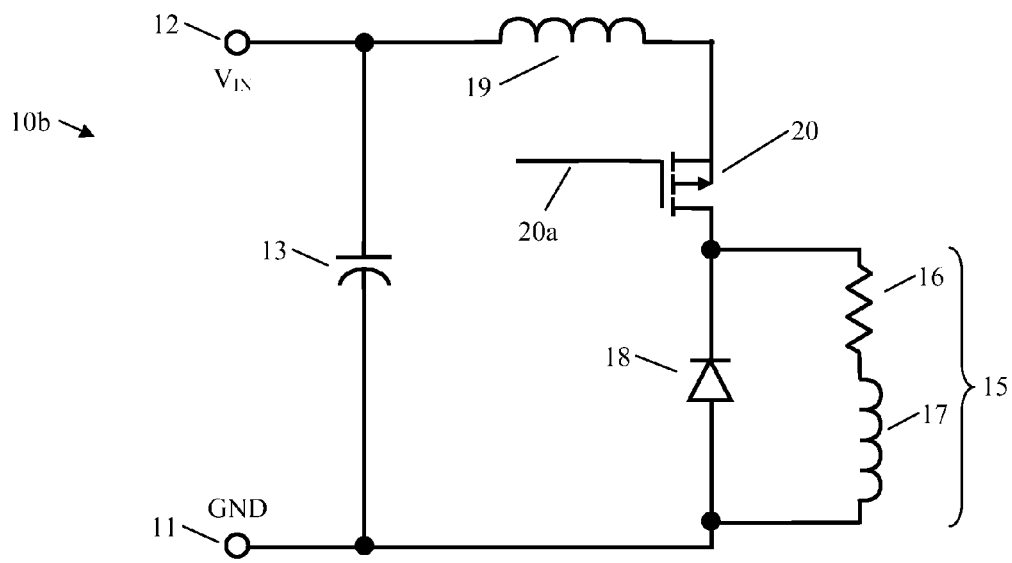
FIG. 1B illustrates a prior art single ended unclamped inductive switching circuit like FIG. 1A but with a p-channel MOSFET

FIG. 1A illustrates a prior art single ended unclamped inductive switching circuit 10a with an n-channel FET where a power main switching FET 20 turns off quickly while carrying an inductive load current prior art $I_{ds}$ 50a from an external inductive switching circuit (ISC) 14. In this case, the external ISC 14 is a series connection of a parasitic circuit inductance 19 and an inductive network 15. The parasitic circuit inductance 19, which is inherently present, is actually distributed throughout the circuit but is modeled in this text as a single component for simplicity's sake. The inductive network 15 is a parallel connection of a free wheeling diode 18 and a serial load branch consists of a load resistor 16 and a load inductor 17. The serial connection of the ISC 14 and the main switching FET 20 is then powered between a supply voltage VIN 12 and ground GND 11 with an input filter capacitor 13. The main switching FET 20, an n-channel MOSFET in this case, is controlled by a main switching FET gate 20a with various terminal voltages marked as $V_{gs}$ prior art 54a and $V_{ds}$ prior art 52a. Notice that the same inductive load current prior art $I_{ds}$ 50a also flows through both the parasitic circuit inductance 19 and the load inductor 17 of the ISC 14. Thus, when the power main switching FET 20 turns off quickly while carrying the inductive load current prior art $I_{ds}$ 50a from the external ISC 14, the abrupt termination of the current in the parasitic inductor 19 leads to severe voltage overshoot and oscillations in the unclamped inductive switching circuit 10a, commonly known as ringing. In many cases the ringing also results in an unintended and totally undesirable re-triggering of the main switching FET 20. As mentioned before, the ringing can also result in high levels of conducted and/or radiated EMI/RFI causing undesirable interference with the operation of other sensitive electronic systems nearby. In the case of FIG. 1A, the power main switching FET 20 is an n-channel FET. FIG. 1B illustrates a prior art p-channel version circuit 10a of FIG. 1A. In this single ended unclamped inductive switching circuit 10b with p-channel FET, the power main switching FET 20 is a p-channel FET. Likewise, when the power main switching FET 20 turns off quickly, the abrupt termination of the current in the parasitic inductor 19 also leads to ringing in the unclamped inductive switching circuit 10b.

Figure 1C:
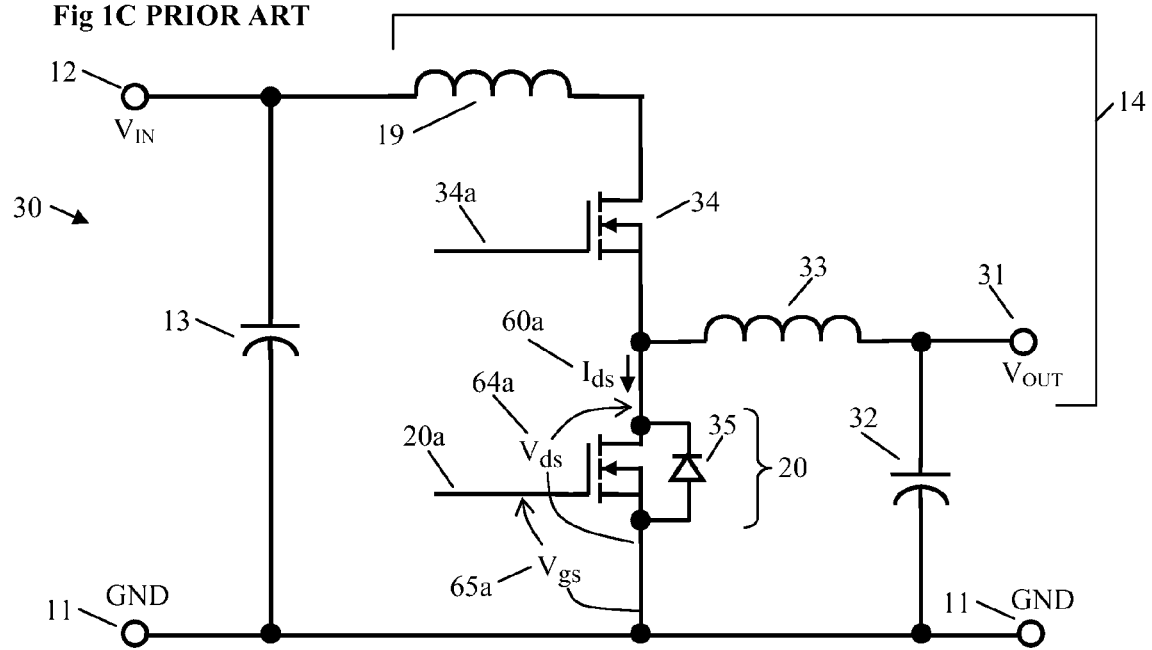

FIG. 1C illustrates another prior art synchronous buck converter 30 circuit where two MOSFETs, a high-side FET (HS FET) 34 controlled by an HS FET gate 34a and a main switching FET 20 with a built-in body diode 35, are connected in series and across a supply voltage VIN 12 and ground GND 11 with an input filter capacitor 13. In the art the main switching FET 20 is typically referred to as low-side FET (LS FET). Thus, the main switching FET 20 works in synchrony with the HS FET 34 to controllably switch an inductive network, in this case consisting of the parasitic circuit inductance 19, a buck inductor 33 and an output filter capacitor 32. From the point of view of the main switching FET 20, it carries an inductive load current prior art $I_{ds}$ 60a from an external ISC 14, in this case consisting of a branched serial connection of the parasitic circuit inductance 19, the high-side FET (HS FET) 34, the buck inductor 33 and the output filter capacitor 32. The main switching FET 20, also an n-channel MOSFET in this case, is controlled by a main switching FET gate 20a with various terminal voltages marked as $V_{gs}$ prior art 65a and $V_{ds}$ prior art 64a. To initiate a switching cycle the main switching FET 20 is first turned off via its main switching FET gate 20a. This forces its body diode 35 to turn on and take over the current. After a time delay the HS FET 34 is turned on via its HS FET gate 34a, which forces the body diode 35 to turn off. However during its turn off process the body diode 35 draws an additional recovery current which flows in the reverse direction, from its cathode to its anode. When the turn off process comes to its completion, the recovery current is forced to zero abruptly. Notice that the same recovery current also flows through the parasitic circuit inductance 19 of the ISC 14. Thus, the abrupt termination of the body diode recovery current also leads to severe voltage overshoot and oscillations in the synchronous buck converter 30, commonly known as ringing. In many cases the ringing also results in an unintended and totally undesirable re-triggering of the main switching FET 20, also known as "shoot through". Again, the ringing can further result in high levels of conducted and/or radiated EMI/RFI causing undesirable interference with the operation of other sensitive electronic systems nearby.

To those skilled in the art, by now it should become clear that the above-described phenomenon of ringing can take place in numerous other similar switching circuits such as half bridge converters or inverters. In general, an abrupt turn-off of a main switching FET in series connection with an ISC that includes an inductive network having at least one inductor element and a parasitic circuit inductance can cause severe voltage overshoot and oscillations in the thus formed circuit. It is important to remark that the voltage overshoot and oscillations will also occur in circuits with parasitic circuit inductance but without an inductive network. However a circuit with an inductive network (non-parasitic inductors) will suffer more severe consequences from the overshoot and oscillations (ringing). More specifically a circuit with an inductive network will: exhibit more power loss due to ringing because of the inductive nature of the load; and have a greater likelihood of unwanted re-triggering of the FET. By now it should also be clear that the abrupt turn off of the main switching FET amounts to a high rate of load current change through the ISC, di/dt, as abbreviated before. Therefore, the ringing can be vastly reduced by limiting di/dt.

Figure 2A:
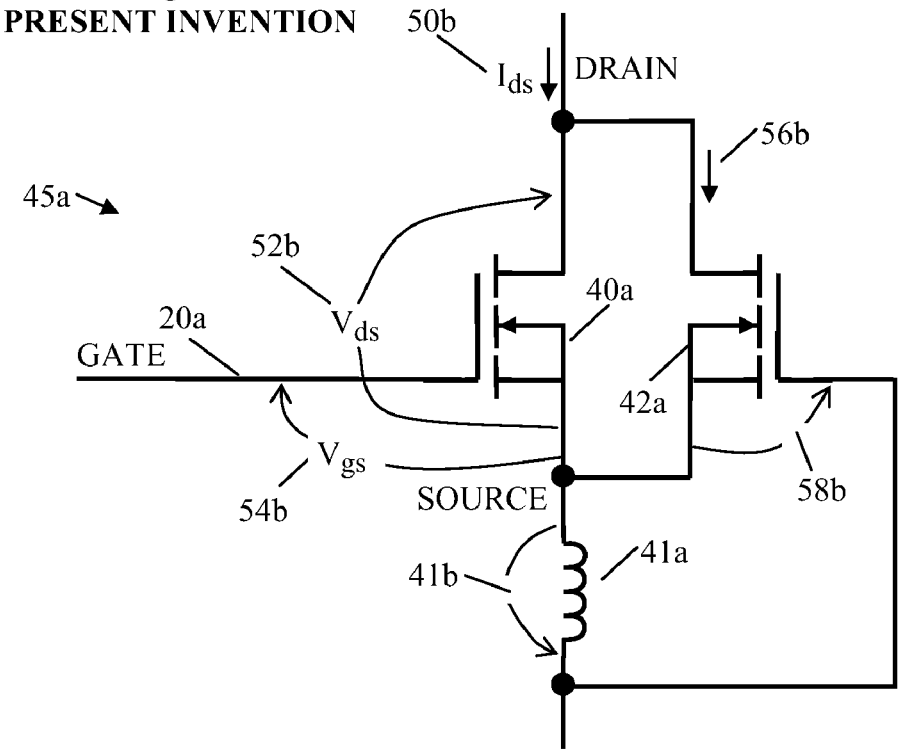
FIG. 2A illustrates the circuit schematic of the present invention device for limiting di/dt embodied in n-channel MOSFETs.

FIG. 2A illustrates the circuit schematic of the present invention device for limiting di/dt 45a embodied in n-channel MOSFETs. Thus, for application in the circuit of FIG. 1A, the device for limiting di/dt 45a will replace the main switching FET 20. For application in the circuit of FIG. 1C, the device for limiting di/dt 45a will replace the main switching FET 20 together with its body diode 35. First, an intervening auxiliary inductor 41a is added in series connection with the main switching n-channel FET 40a through its SOURCE. In operation, the auxiliary inductor 41a would induce an auxiliary inductive voltage 41b there across that is proportional to the di/dt. Second, an auxiliary n-channel FET 42a is added in parallel connection with the main switching n-channel FET 40a. The gate of the auxiliary n-channel FET 42a is further connected to a terminal of the auxiliary inductor 41a so as to result in a auxiliary FET gate voltage $V_{gs}$ 58b equal to the auxiliary inductive voltage 41b. Whenever the current in the main switching n-channel FET 40a is turning off with a rate di/dt, the auxiliary inductor 41a would first induce an auxiliary inductive voltage 41b automatically. Upon a tendency of the di/dt to exceed a pre-determined maximum rate of decrease (di/dt)MAX, this auxiliary inductive voltage 41b, being equal to the gate threshold voltage of the auxiliary FET $V_{gs}$ 58b, then acts to turn on the auxiliary n-channel FET 42a and produce an auxiliary FET current 56b parallel to the current flow through the main switching n-channel FET 40a. Thus, the auxiliary FET current 56b counteracts further decrease of di/dt of the inductive load current present invention $I_{ds}$ 50b by limiting the maximum magnitude of di/dt to $(di/dt)_{MAX}$. Notice that:

a steady inductive load current present invention $I_{ds}$ 50b results in a di/dt=0 thus auxiliary inductive voltage 41b=0.
an increasing inductive load current present invention $I_{ds}$ 50b results in a di/dt>0 thus auxiliary inductive voltage 41b<0.
Under the above conditions the auxiliary n-channel FET 42a would stay turned-off thus essentially producing no unwanted effects. For those skilled in the art, of course, the numerous device electrical parameters of the auxiliary inductor 41a and the auxiliary n-channel FET 42a need to be properly sized to function as described and this can be achieved through analytic circuit simulation and/or actual parametric experimentation. For example, an auxiliary inductor 41a of higher inductance tends to produce a higher auxiliary inductive voltage 41b which lowers (di/dt)MAX. On the other hand, an auxiliary n-channel FET 42a of higher gate threshold voltage tends to produce a higher (di/dt)MAX. This is undesired, as a large di/dt during turn-off will result in ringing and other problems previously mentioned.

Figure 2B:
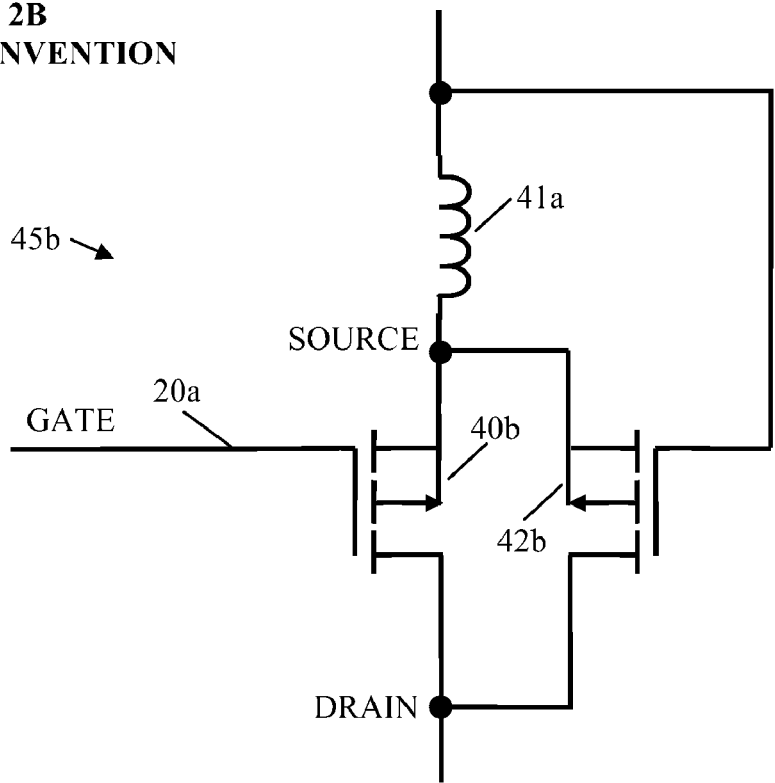
FIG. 2B illustrates the circuit schematic of the present invention device for limiting di/dt embodied in p-channel MOSFETs.

While the present invention device for limiting di/dt is described above in detail using n-channel MOSFETs, to those skilled in the art the present invention device for limiting di/dt is equally applicable using p-channel MOSFETs as well and this is illustrated in the device for limiting di/dt 45b of FIG. 2B with an added auxiliary inductor 41a and an added auxiliary p-channel FET 42b to a main switching p-channel FET 40b as shown. For application in the circuit of FIG. 1B, the device for limiting di/dt 45b of FIG. 2B will replace the main switching FET 20 of FIG. 1B.

Figure 3A:
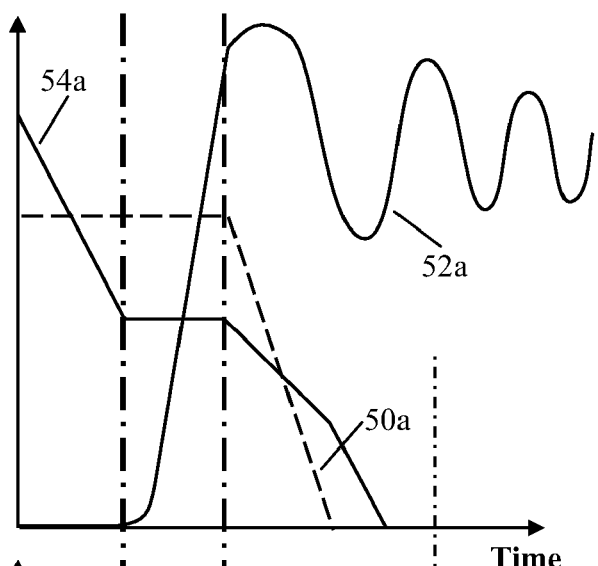
FIG. 3A illustrates numerous voltage and current waveforms associated with the prior art single ended unclamped inductive switching circuit of FIG. 1A during turn off of its power MOSFET.
Figure 3B:
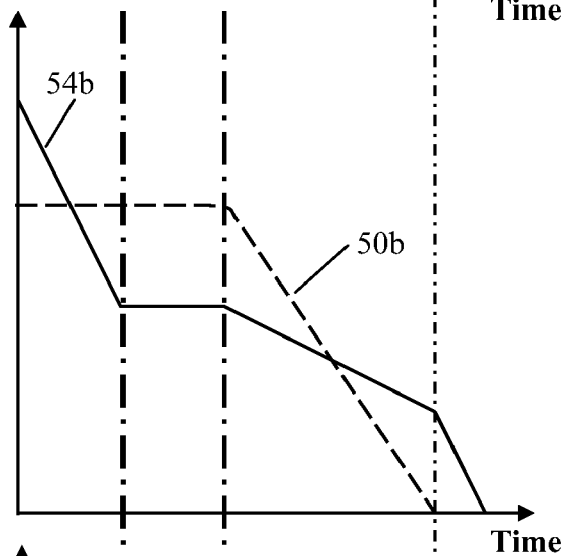
FIG. 3B and FIG. 3C illustrate numerous voltage and current waveforms corresponding to FIG. 3A after incorporation of the present invention device for limiting di/dt of FIG. 2A.
Figure 3C:
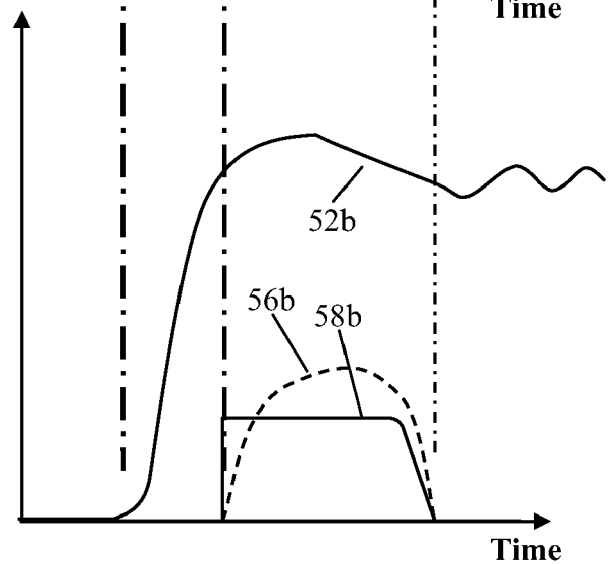

Next, the numerous voltage and current waveforms associated with the prior art single ended unclamped inductive switching circuit 10 of FIG. 1A during turn off of its main switching FET 20 and after incorporation of the present invention device for limiting di/dt 45a of FIG. 2A are illustrated in FIG. 3A, FIG. 3B and FIG. 3C, with FIG. 3A being the prior art followed by FIG. 3B and FIG. 3C together being the present invention. Comparing the inductive load current prior art $I_{ds}$ 50a with the inductive load current present invention $I_{ds}$ 50b shows a di/dt that is much reduced with the present invention. Correspondingly, comparing the $V_{ds}$ prior art 52a with the $V_{ds}$ present invention 52b shows a voltage overshoot and a ringing that are much reduced with the present invention as a result. As a reference, the associated gate voltages $V_{gs}$ prior art 54a and $V_{gs}$ present invention 54b are overlaid to show a correspondingly slowed down decline of the gate voltage of the main switching FET 20. In addition, FIG. 3C also illustrates the auxiliary FET $V_{gs}$ 58b and the resulting auxiliary FET current 56b that counteracts further decrease of di/dt of the inductive load.

Figure 4A:
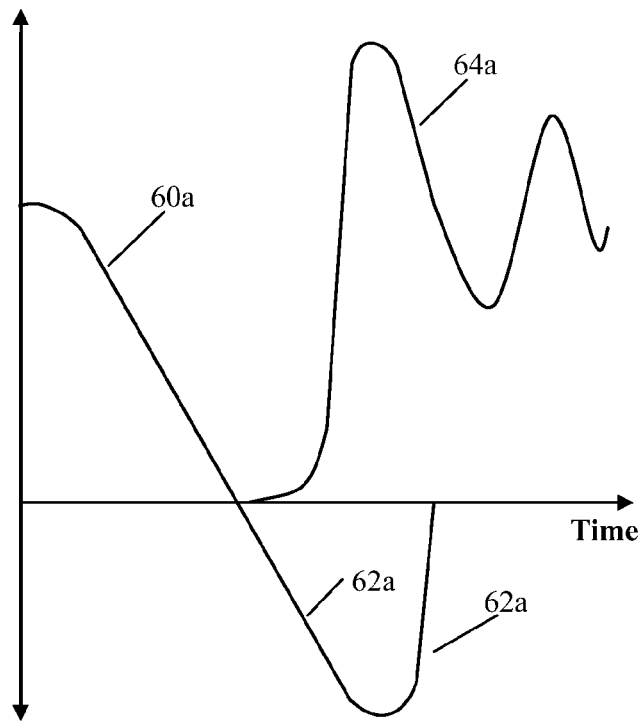
FIG. 4A illustrates numerous voltage and current waveforms associated with the prior art synchronous buck converter circuit of FIG. 1C during turn off of its low side MOSFET.
Figure 4B:
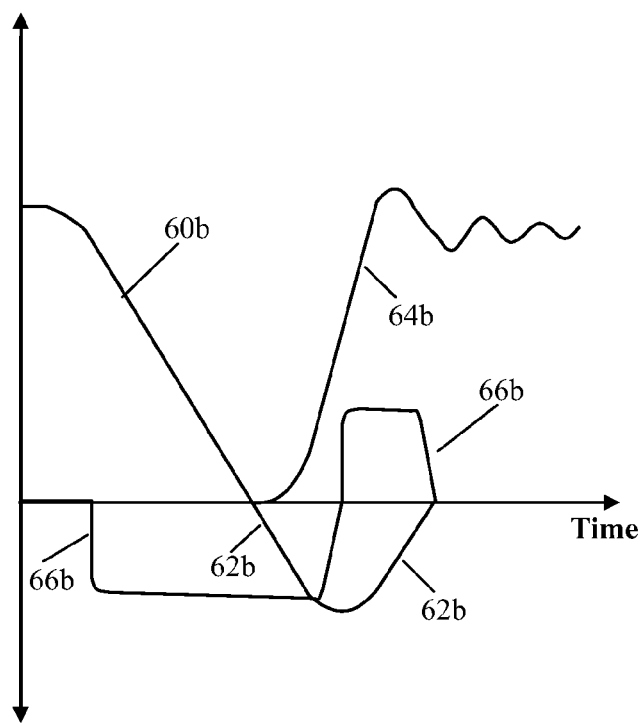
FIG. 4B illustrates numerous voltage and current waveforms corresponding to FIG. 4A after incorporation of the present invention device for limiting di/dt of FIG. 2A.

The numerous voltage and current waveforms associated with the prior art synchronous buck converter 30 of FIG. 1C during turn off of its main switching FET 20 and after incorporation of the present invention device for limiting di/dt 45a of FIG. 2A are illustrated in FIG. 4A and FIG. 4B, with FIG. 4A being the prior art and FIG. 4B being the present invention. Notice the inductive load current prior art $I_{ds}$ 60a has a portion named body diode reverse recovery current prior art 62a that was drawn by the body diode 35 during its forced turn off by the HS FET 34 as mentioned before. Likewise, the inductive load current present invention $I_{ds}$ 60b has a portion named body diode reverse recovery current present invention 62b. Comparing the tail end of the body diode reverse recovery current prior art 62a with that of the body diode reverse recovery current present invention 62b shows a di/dt that is much reduced with the present invention. Thus, the auxiliary n-channel FET 42a allows the body diode reverse recovery current to turn off slowly and makes the body diode 35 look like one with soft recovery feature by extending its turn off time interval. Correspondingly, comparing the $V_{ds}$ prior art 64a with the $V_{ds}$ present invention 64b shows a voltage overshoot and a ringing that are much reduced with the present invention as a result. The accompanying auxiliary FET $V_{gs}$ 66b is also illustrated in FIG. 4B.

Figure 5A:
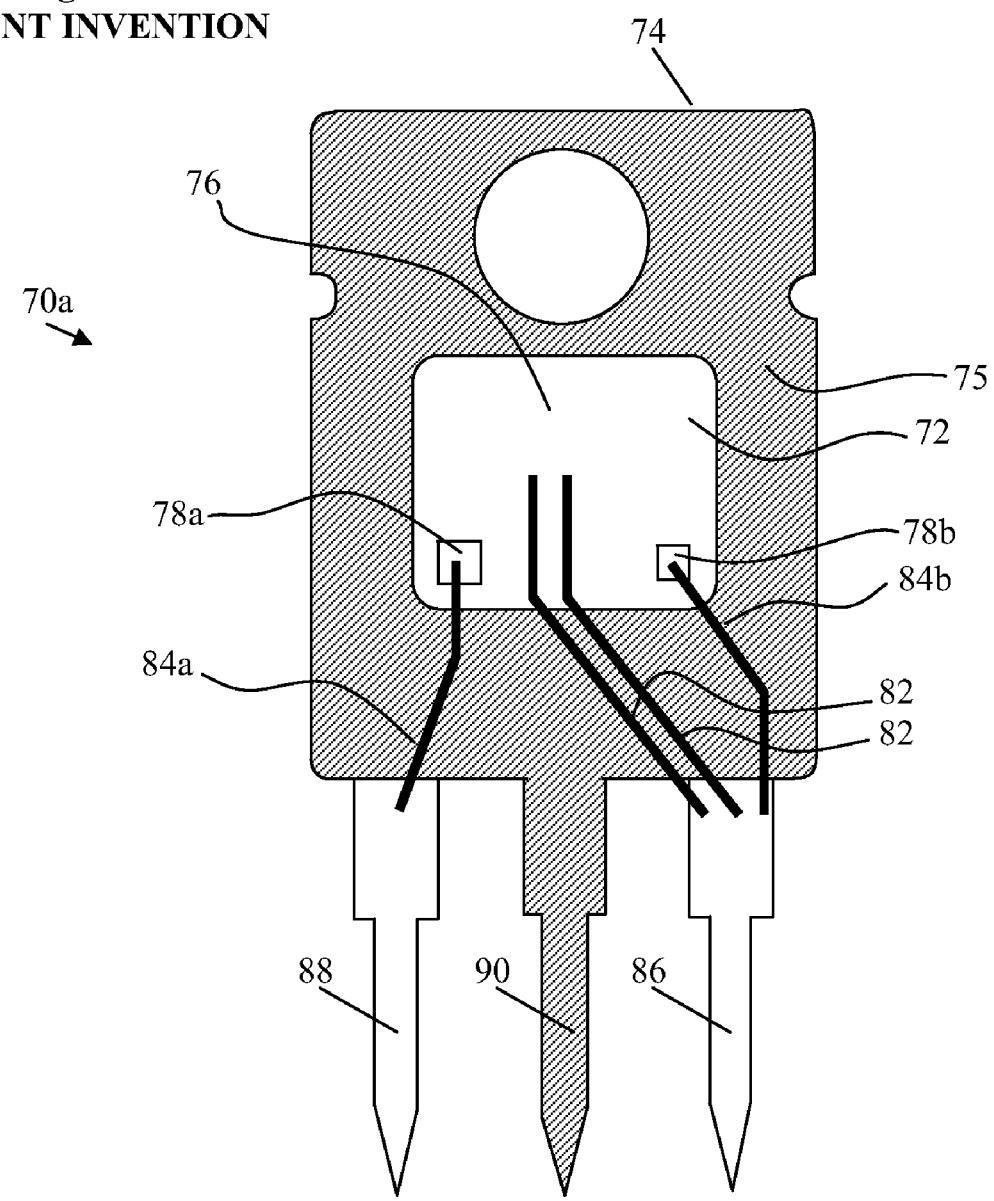
FIG. 5A illustrates a packaged device for limiting di/dt of the present invention in the form of a dual-gate FET with an auxiliary inductor implemented as a parasitic inductance of an inherently required bonding wire.

FIG. 5A illustrates a packaged single die device for limiting di/dt 70a of the present invention in the form of a dual-gate FET with the auxiliary inductor 41a implemented as a parasitic inductance of an inherently required bonding wire. As the bonding wire with its accompanying inductance is already present in device packages today, the present invention utilizes it as the auxiliary inductor 41a. In this case the packaged single die device for limiting di/dt 70a is illustrated in the form of a TO-220 package. Notice that numerous components from the circuit schematic of the present invention device for limiting di/dt 45a of FIG. 2A are referenced here. As the auxiliary n-channel FET 42a and the main switching n-channel FET 40a are connected in parallel, they can be made from a single MOSFET die 72 and share a common source 76 and a common drain (not shown) making the packaged single die device for limiting di/dt 70a effectively a dual-gate FET having a main switching FET gate 78a and an auxiliary FET gate 78b. The single MOSFET die 72 seats, via its bottom surface having the common drain (not shown), atop a die pad 75 of leadframe 74. Through the die pad 75, the common drain (not shown) of the single MOSFET die 72 is connected to a device drain pin 90. The top surface of the single MOSFET die 72 carries the common source 76, the main switching FET gate 78a and the auxiliary FET gate 78b. The main switching FET gate 78a and auxiliary FET gate 78b are, respectively, connected to a device gate pin 88 and a device source pin 86 with a main switching FET gate lead 84a and an auxiliary FET gate lead 84b. Notably, a number of source wires with parasitic inductance 82 are used to bond the common source 76 to the device source pin 86. While these source wires 82 are inherently required to connect the source of the main switching n-channel FET 40a to the device source pin 86, the number and geometry of these source wires 82 can be selected such that their parasitic inductance is equal to that of the desired auxiliary inductor 41a therefore simplify the device packaging with reduced cost while retaining the function of controlling the di/dt.

Figure 5B:
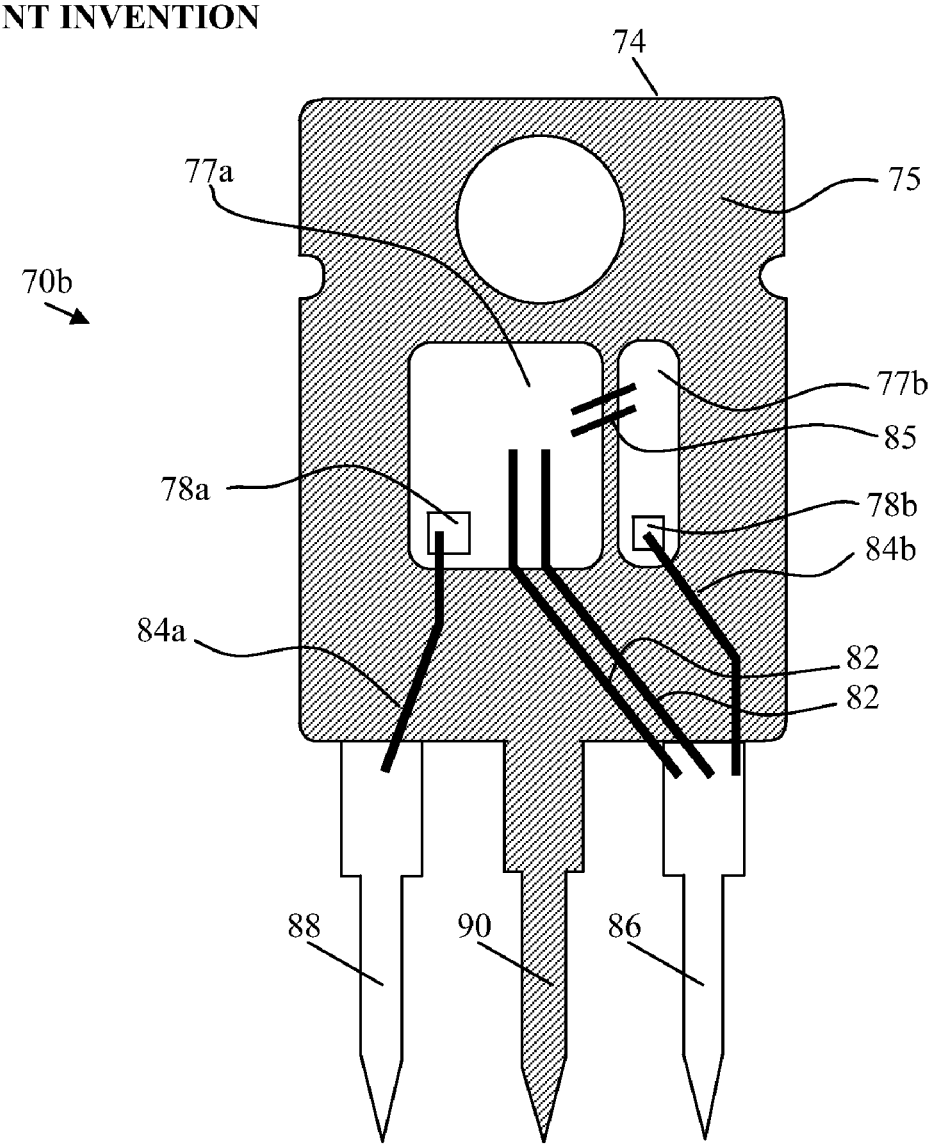
FIG. 5B illustrates a packaged device for limiting di/dt of the present invention in the form of co-packaged MOSFETs where the main FET and the auxiliary FET are made on separate dies.

By now it should also become clear to those skilled in the art that the just described device packaging configuration also applies to cases where the main switching FET and the auxiliary FET are both p-channel FETs. FIG. 5B illustrates a device of co-packaged dies for limiting di/dt 70b of the present invention in the form of two co-packaged dies in which the main switching n-channel FET 40a is a separate die from the auxiliary n-channel FET 42a and in which both dies are situated on the same die pad 75 of leadframe 74. The main n-channel FET 40a has a separate main FET source 77a from the auxiliary FET source 77b, and also separate drains (not shown). The main FET source 77a and the auxiliary FET source 77b are connected by inter-die source bond wires 85. Alternatively, the two sources 77a and 77b can be connected with a clip or a plate. The drains of the main FET 40a and auxiliary FET 42a are connected via the die pad 75. To those skilled in the art the just described device packaging configuration also applies to cases where the main switching FET and the auxiliary FET are both p-channel FETs.

Figure 6A:
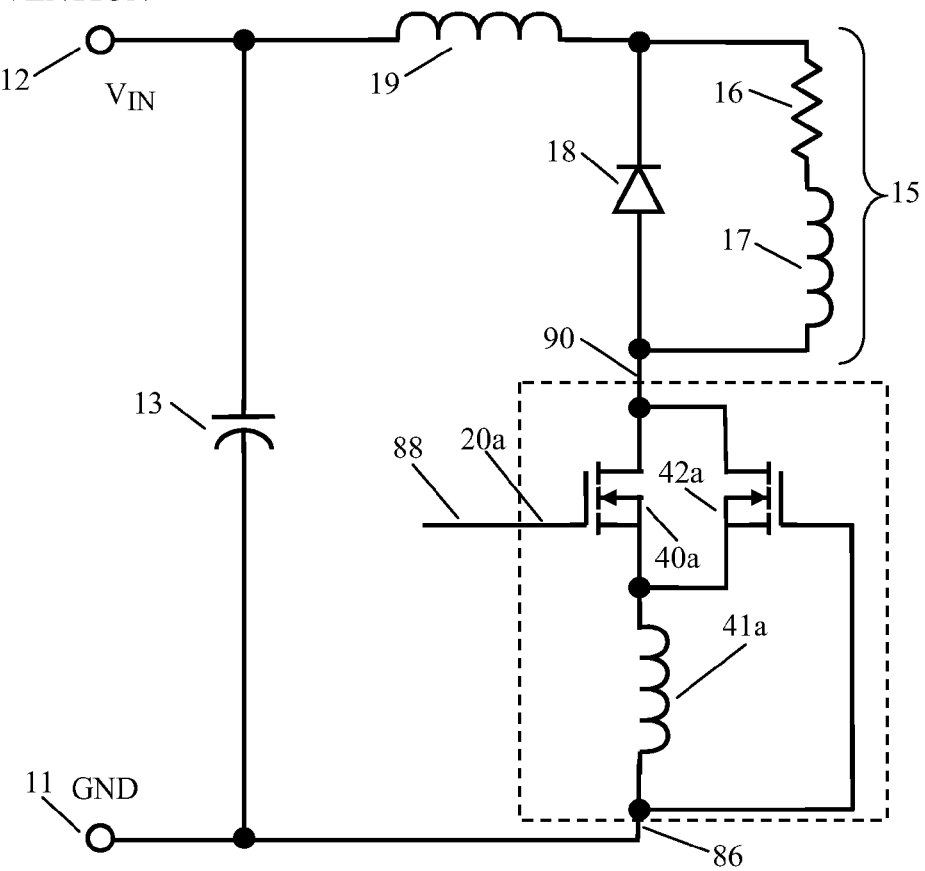
FIG. 6A shows an expanded circuit schematic of the single ended unclamped inductive switching circuit of FIG. 1A after incorporation of the present invention device for limiting di/dt of FIG. 2A.

As a further illustration of the present invention as applied to n-channel MOSFETs, FIG. 6A shows an expanded circuit schematic of the single ended unclamped inductive switching circuit of FIG. 1A after incorporation of the present invention device for limiting di/dt of FIG. 2A. Using terminologies of the packaged device of FIG. 5, the device source pin 86, being the same as one terminal of the auxiliary inductor 41a and the gate of the auxiliary n-channel FET 42a, is connected to the ground GND 11. The device drain pin 90, the same as the drains of the main switching n-channel FET 40a and the auxiliary n-channel FET 42a, is connected to the inductive network 15. The inductive network 15 is in turn connected to supply voltage VIN 12 through the parasitic inductance 19.

Figure 6B:
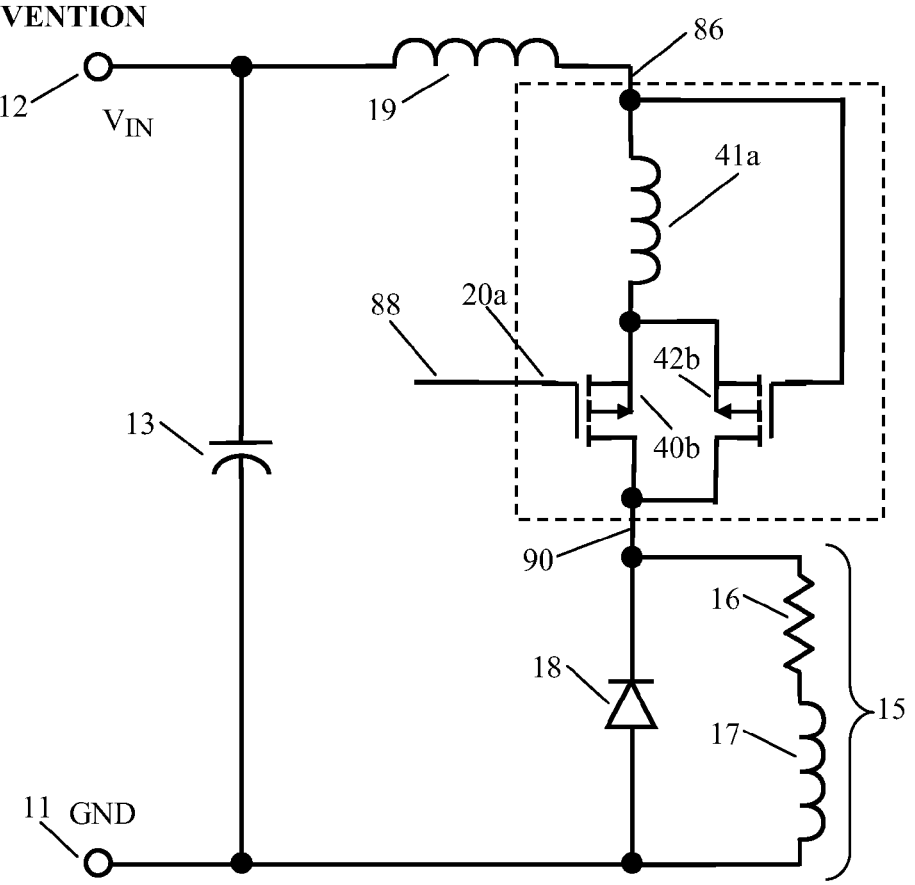
FIG. 6B shows an expanded circuit schematic of the single ended unclamped inductive switching circuit of FIG. 1B after incorporation of the present invention device for limiting di/dt of FIG. 2B.

FIG. 6B shows an expanded circuit schematic of the single ended unclamped inductive switching circuit of FIG. 1B after incorporation of the present invention device for limiting di/dt of FIG. 2B. Using terminologies of the packaged device of FIG. 5A, the device source pin 86, being the same as one terminal of the auxiliary inductor 41a and the gate of the auxiliary p-channel FET 42b, is connected to the supply voltage VIN 12 through the parasitic circuit inductance 19. The device drain pin 90, being the same as the drains of the main switching p-channel FET 40b and the auxiliary p-channel FET 42b, is connected to the inductive network 15. The inductive network 15 is in turn connected to ground GND 11.

By now it should become clear to those skilled in the art that the numerous embodiments just described can be readily modified to suit other specific applications as well. For example, while the preferred low cost method of implementing the auxiliary MOSFET is to make it an integral part of the main switching FET, the auxiliary MOSFET can nevertheless be constructed on a separate die then co-packaged with the main switching FET onto a leadframe with a potential advantage of keeping separate current paths between the two FETs. For another example, while the TO-220 package is illustrated for the packaged single die device for limiting di/dt 70a and co-packaged dies device for limiting di/dt 70b, it should be understood that the present invention device can be applicable to any other MOSFET packages.

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

What is claimed are:

1. A circuit for limiting di/dt caused by a main switching FET during its unclamped or partially unclamped inductive turn-off, the circuit comprises an intervening auxiliary inductor having a first terminal in series connection with the main switching FET through its source; and an auxiliary FET, in parallel connection with the main switching FET and having a gate of said auxiliary FET connected to a second terminal of said auxiliary inductor, wherein a source of said auxiliary FET being connected to the first terminal of said auxiliary inductor.

2. The circuit for limiting di/dt of claim 1 wherein said main switching FET is further coupled to an external inductive switching circuit (ISC) comprising: a ground GND and a supply voltage VIN; and an inductive network having at least one of a parasitic inductance or an inductor element therein whereby the circuit for limiting di/dt controllably switches the ISC while limiting said maximum magnitude of di/dt to (di/dt).sub.MAX thus preventing an associated excessive voltage overshoot and ringing during the turn-off of said main switching FET.

3. The circuit for limiting di/dt of claim 2 wherein said main switching FET and said auxiliary FET are both n-channel FETs.

4. The circuit for limiting di/dt of claim 3 wherein: the VIN is connected to the inductive network; one terminal of the auxiliary inductor and the gate of the auxiliary FET are both connected to the GND; and the drains of the main switching FET and the auxiliary FET are both connected to the inductive network.

5. The circuit for limiting di/dt of claim 2 wherein said main switching FET and said auxiliary FET are both p-channel FETs.

6. The circuit for limiting di/dt of claim 5 wherein: one terminal of the auxiliary inductor and the gate of the auxiliary FET are both connected to the VIN; the drains of the main switching FET and the auxiliary FET are both connected to the inductive network; and the inductive network is in turn connected to the GND.

7. The circuit for limiting di/dt of claim 3 wherein: said ISC further comprises a high-side FET; the main switching FET acts as a low-side FET working in synchrony with the high-side FET to controllably switch the inductive network; the VIN is connected to the high-side FET; and the auxiliary inductor and the gate of the auxiliary FET are both connected to the GND.

8. A device with limited di/dt during its unclamped or partially unclamped inductive turn-off, the device comprises a main switching FET; an intervening auxiliary inductor having a first terminal in series connection with the main switching FET through its source; and an auxiliary FET, in parallel connection with said main switching FET and having a gate of said auxiliary FET connected to a second terminal of said auxiliary inductor, wherein a source of said auxiliary FET being connected to the first terminal of said auxiliary inductor.

9. The device of claim 8 wherein the main switching FET and the auxiliary FET are further embodied to be formed from a single die and share a common source and a common drain whereby make the said device for limiting di/dt a dual-gate FET.

10. The device of claim 8 wherein the main switching FET and the auxiliary FET are further embodied to be formed from separate dies co-packaged together onto a leadframe.

11. The device of claim 8 wherein, at the final device packaging level, the auxiliary inductor is embodied as a parasitic inductance of an inherently required bonding wire connecting the source of the main switching FET to its corresponding external terminal whereby simplify the device packaging with reduced cost.

12. The device of claim 8 wherein said main switching FET and said auxiliary FET are both n-channel FETs.

13. The device of claim 8 wherein said main switching FET and said auxiliary FET are both p-channel FETs.

14. A packaged semiconductor device comprises a main switching FET having a source connected to a first terminal, a drain connected to a second terminal and a gate connected to a third terminal; and an auxiliary FET having a source connected to the source of the main switching FET, a drain connected to the second terminal and a gate connected to the first terminal, wherein a bonding wire connecting the source of the main FET to the first terminal providing a parasitic inductance connected between the source of the main FET and the gate of the auxiliary FET.

15. The device of claim 14 wherein said main switching FET and said auxiliary FET are both p-channel FETs.

16. The device of claim 14 wherein the main switching FET and the auxiliary FET are further embodied to be formed from a single die and share a common source and a common drain whereby make the said device a dual-gate FET.

17. The device of claim 14 wherein the main switching FET and the auxiliary FET are further embodied to be formed from separate dies co-packaged together onto a leadframe.

18. The device of claim 17 further comprises a bond wire connecting the source of the auxiliary FET to the source of the main FET.

19. The device of claim 14 wherein said main switching FET and said auxiliary FET are both n-channel FETs.

* * * * *